United States Patent
Kim

(10) Patent No.: US 6,284,626 B1
(45) Date of Patent: Sep. 4, 2001

(54) ANGLED NITROGEN ION IMPLANTATION FOR MINIMIZING MECHANICAL STRESS ON SIDE WALLS OF AN ISOLATION TRENCH

(75) Inventor: Hyeon-Seag Kim, Sunnyvale, CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

(21) Appl. No.: 09/286,830

(22) Filed: Apr. 6, 1999

(51) Int. Cl.$^7$ ............ H01L 21/76; H01L 21/31; H01L 21/469

(52) U.S. Cl. ............ 438/433; 438/424; 438/425; 438/426; 438/440; 438/433; 438/434; 438/443; 438/444; 438/445; 438/447

(58) Field of Search ............ 438/443, 444, 438/445, 447, 424, 451, 440, 423, 425, 426, 765, 766, 769, 770

(56) References Cited

U.S. PATENT DOCUMENTS

| | | | |
|---|---|---|---|
| 4,873,203 | * 10/1989 | Kaga et al. | 437/67 |
| 5,061,653 | * 10/1991 | Teng | 437/67 |
| 5,112,772 | * 5/1992 | Wilson et al. | 437/67 |
| 5,376,576 | * 12/1994 | Moon et al. | 437/52 |
| 5,445,989 | * 8/1995 | Lur et al. | 437/67 |
| 5,811,347 | * 9/1998 | Gardner | 438/435 |
| 5,915,191 | * 6/1999 | Jun | 438/431 |
| 6,001,706 | * 12/1999 | Tan et al. | 438/424 |
| 6,063,694 | * 5/2000 | Togo | 438/440 |
| 6,100,163 | * 8/2000 | Jang et al. | 438/437 |
| 6,133,113 | * 10/2000 | Jenq et al. | 438/424 |
| 6,146,970 | * 11/2000 | Witek et al. | 438/424 |
| 6,165,869 | * 12/2000 | Qian et al. | 438/424 |
| 6,165,906 | * 12/2000 | Bandyopadhyay et al. | 438/700 |
| 6,184,106 | * 2/2001 | Chung | 438/425 |

OTHER PUBLICATIONS

A. Chatterjee, D. Rogers, J. McKee, I. Ali, S. Nag, and I.–C. Chen, A Shallow Trench Isolation using LOCOS Edge for Preventing Corner Effects for 0.25/0.18μm CMOS Technologies and Beyond, IEDM, 1996 pp. 829–832.

H. Watanabe, K. Shimizu, Y. Takeuchi, and S. Aritome, Corner–Rounded Shallow Trench Isolation Technology to Reduce the Stress–Induced Tunnel Oxide Leakage Current for Highly Reliable Flash Memories, IEDM, 1996 pp. 833–836.

M.H. Park, S. H. Hong, S.J. Hong, T. Park, S. Song, J.H. Park, H. S. Kim, Y.G. Shin, H.K. Kang, and M.Y. Lee, Stress Minimization in Deep Sub–Micron Full CMOS Devices by Using an Optimized Combination of Trench Filling CVD Oxides, IEDM, 1997 pp. 669–672.

(List continued on next page.)

Primary Examiner—Matthew Smith
Assistant Examiner—Chuong A Luu
(74) Attorney, Agent, or Firm—Monica H. Choi

(57) ABSTRACT

With the present invention, a filled isolation trench is fabricated as part of an integrated circuit on a semiconductor wafer using nitrogen implantation into at least one side wall of the isolation trench. An isolation trench is etched within a layer of semiconductor material. The isolation trench has at least one side wall comprised of the semiconductor material, and the isolation trench has a bottom wall. Nitrogen ions are implanted into the at least one side wall of the isolation trench. A layer of an insulator material is thermally grown from the at least one side wall and the bottom wall of the isolation trench. The isolation trench is then filled with the insulator material using a deposition process to form the filled isolation trench. With the present invention, the nitrogen ions implanted into the at least one side wall of the isolation trench reduce a radius of a bird's beak formed on the at least one side wall of the isolation trench. In addition, the nitrogen ions implanted into the at least one side wall of the isolation trench reduce mechanical stress on the at least one side wall of the isolation trench from the insulator material filling the isolation trench.

9 Claims, 5 Drawing Sheets

OTHER PUBLICATIONS

K. Ishimaru, F. Matsuoko, M. Takahashi, M. Nishigohri, Y. Okayama, Y. Unno, M. Yabuki, K. Umezawa, N. Tsuchiya, O. Fujii, and M. Kinugawa, Mechanical Stress Induced MOSFET Punch–through and Process Optimization for Deep Submicron TEOS–$O_3$ filled STI Device, Symposium on VLSI Technology Digest of Technical Papers, 1997 pp. 123–124.

T. Ogura, T. Yamamoto, Y. Saito, Y. Hayashi, and T. Mogami, A Shallow Trench Isolation with SiN Guard–Ring for Sub–Quarter Micron CMOS Technologies, Symposium on VLSI Technology Digest of Technical Papers, 1998 pp. 210–211.

* cited by examiner

ANGLED NITROGEN ION IMPLANTATION FOR MINIMIZING MECHANICAL STRESS ON SIDE WALLS OF AN ISOLATION TRENCH

TECHNICAL FIELD

This invention relates to technology for isolating active device regions in integrated circuits such as shallow trench isolation (STI) technology, and more particularly, to a method for fabricating an isolation trench having at least one side wall with nitrogen ions implanted therein to minimize mechanical stress on the at least one side wall of the isolation trench from the insulator material filling the isolation trench.

BACKGROUND OF THE INVENTION

Referring to FIG. 1, for integrated circuits fabricated on a semiconductor wafer 102, an epitaxial silicon layer 104 is deposited on the semiconductor wafer 102. An active device region 106 is isolated within the epitaxial silicon layer 104 by a first isolation trench 108 and a second isolation trench 110, as is common in shallow trench isolation (STI) technology. In the example of FIG. 1, the active device region 106 includes a MOSFET (Metal Oxide Semiconductor Field Effect Transistor) having a drain 112, a source 114, and a gate oxide 116 fabricated within the active device region 106.

FIG. 2, which includes FIGS. 2A, 2B, 2C, 2D, 2E, and 2F, illustrates the fabrication of the first and second isolation trenches 108 and 110. Elements having the same reference numeral in FIGS. 1, 2A, 2B, 2C, 2D, 2E, and 2F refer to elements having similar structure and function. Referring to FIG. 2A, after the epitaxial silicon layer 104 is deposited on the semiconductor wafer 102, a pad oxide layer 202 comprised of silicon dioxide is deposited on the epitaxial silicon layer 104. Then, a nitride layer 204 comprised of silicon nitride is deposited on the pad oxide layer 202. The first isolation trench 108 and the second isolation trench 110 are patterned and etched using conventional photoresist patterning technology as known to one of ordinary skill in the art of integrated circuit fabrication.

The first isolation trench 108 and the second isolation trench 110 are etched in the epitaxial silicon layer 104 through the nitride layer 204 and the pad oxide layer 202. The first isolation trench 108 and the second isolation trench 110 each have at least one side wall and a bottom wall. In the example of FIG. 2A, the at least one side wall and the bottom wall of the first and second isolation trenches 108 and 110 are formed by the semiconductor material (i.e. silicon in the example of FIG. 2) of the epitaxial silicon layer 104.

Referring to FIG. 2B, once the first isolation trench 108 and the second isolation trench 110 are etched, a linear oxide layer 206 which is a layer of insulator material is thermally grown from the at least one side wall and the bottom wall of the first isolation trench 108 and the second isolation trench 110, as known to one of ordinary skill in the art of integrated circuit fabrication. Such thermal growth ensures a structurally smooth transition from the silicon at the at least one side wall and the bottom wall of an isolation trench to the silicon dioxide filling the isolation trench.

Referring to FIG. 2C, once the linear oxide layer 206 is thermally grown from the at least one side wall and the bottom wall of the isolation trenches 108 and 110, the isolation trenches 108 and 110 are filled with insulator material 208 such as silicon dioxide using a deposition process as known to one of ordinary skill in the art of integrated circuit fabrication. Typically, to enhance the insulating capability of the insulator material 208 such as the silicon dioxide filling the isolation trenches 108 and 110, the insulator material 208 thus deposited is densified using a thermal densification process as known to one of ordinary skill in the art of integrated circuit fabrication.

Referring to FIG. 2D, the insulator material 208 is then polished down to the nitride layer 204 using a chemical mechanical polishing (CMP) process, as known to one of ordinary skill in the art of integrated circuit fabrication. The nitride layer 204 acts as a stop layer in the chemical mechanical polishing (CMP) process. Referring to FIG. 2E, the nitride layer 204 is then removed, and the active device region 106 is defined by ion implantation for forming devices of the integrated circuit including the drain 112 and the source 114 of a MOSFET. The pad oxide layer 202 is a sacrificial oxide layer which minimizes damage to the surface of the epitaxial silicon layer 104 during this ion implantation. Referring to FIG. 2F, the pad oxide layer 202 is then etched (as well as the top portion of the insulator material 208 filling the isolation trenches 108 and 110), and the gate oxide of the MOSFET within the active device region 106 is fabricated.

FIGS. 1, 2A, 2B, 2C, 2D, 2E, and 2F illustrate ideal shapes for isolation trenches 108 and 110. Referring to FIG. 3, a more realistic shape for the first isolation trench 108 within the box with the dashed lines in FIG. 2C is shown. The side wall 302 of the first isolation trench 108 is not perfectly vertical, but rather is sloped. In addition, as illustrated in FIG. 3, the top and bottom of the side wall 302 is rounded to form a bird's beak at the side wall 302 of the first isolation trench 108, as known to one of ordinary skill in the art of integrated circuit fabrication. Such corner rounding occurs during thermal growth of the layer of insulator material 206 from the side wall and the bottom wall of the first isolation trench 108 as the semiconductor material at the side wall and the bottom wall of the first isolation trench 108 is consumed during such a process.

The amount of such corner rounding may be measured by the radius of a circle 304 that fits to the rounded corner at the top of the side wall 302 of the first isolation trench 108, as shown in FIG. 3. Referring to FIGS. 2C and 3, such corner rounding reduces the effective area of the active device region 106. As device densities continuously increase and as device geometries continuously decrease with design of smaller geometry active device regions, such reduction in the effective area of the active device region 106 is especially disadvantageous.

In addition, the side wall 302 of the isolation trench 108 is subject to mechanical stress from the insulator material 208 filling the isolation trench 108. Such mechanical stress may form especially from the thermal densification of the insulator material 208 filling the isolation trench 108 as the insulator material 208 expands or contracts within the isolation trench 108. Referring to FIGS. 2C and 3, such mechanical stress has a detrimental effect on the devices within the active device region 106 adjacent the isolation trench 108. As described in a technical journal article with title "Mechanical Stress Induced MOSFET Punch-Through and Process Optimization for Deep Submicron TEOS-$O_3$ filled STI Device," by K. Ishimaru at al. in the Symposium on VLSI Technology Digest of Technical Papers, 1997, pages 123–124, such mechanical stress results in failure of devices within the active device region 106. For the example of the MOSFET within the active device region 106, the MOSFET has higher leakage current from such mechanical stress which may lead to failure of the integrated circuit.

Thus, a process for forming a filled isolation trench such as in shallow trench isolation (STI) technology which results in minimized corner rounding and/or in reduced mechanical stress on the side wall of the isolation trench is desired.

SUMMARY OF THE INVENTION

Accordingly, the present invention uses nitrogen ion implantation for fabrication of a filled isolation trench such as in shallow trench isolation (STI) technology with minimized corner rounding and reduced mechanical stress on the at least one side wall of the isolation trench.

Generally, the present invention is a method for fabricating a filled isolation trench as part of an integrated circuit on a semiconductor wafer, and the method includes the step of etching an isolation trench within a layer of semiconductor material. The isolation trench has at least one side wall comprised of the semiconductor material, and the isolation trench has a bottom wall. The present invention also includes the step of implanting nitrogen ions into the at least one side wall of the isolation trench. The present invention further includes the steps of thermally growing a layer of an insulator material from the at least one side wall and the bottom wall of the isolation trench and filling the isolation trench with the insulator material using a deposition process to form the filled isolation trench.

The nitrogen ions implanted into the at least one side wall of the isolation trench reduces a radius of a bird's beak formed on the at least one side wall of the isolation trench. In addition, the nitrogen ions implanted into the at least one side wall of the isolation trench reduces mechanical stress on the at least one side wall of the isolation trench from the insulator material filling the isolation trench.

These and other features and advantages of the present invention will be better understood by considering the following detailed description of the invention which is presented with the attached drawings.

BRIEF DESCRIPTION OF THE DRAWINGS

FIG. 2, including

FIG. 4, including

FIG. 5, including FIG. 6, including

Figure 1:
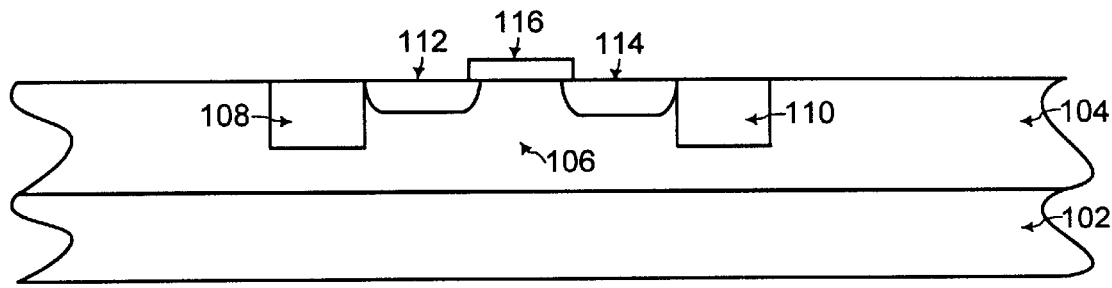
FIG. 1 shows a cross-section of an active device region isolated by a first isolation trench and a second isolation trench within an epitaxial silicon layer.

The figures referred to herein are drawn for clarity of illustration and are not necessarily drawn to scale. Moreover, the figures referred to herein focus on a few regions within a larger integrated circuit. Elements having the same reference numeral in FIGS. 1, 2, 3, 4, 5, and 6 refer to elements having similar structure and function.

DETAILED DESCRIPTION

Figure 4A:
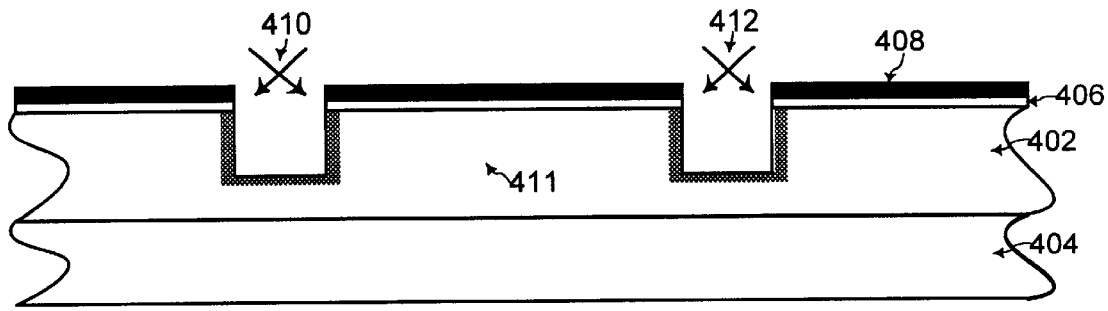
FIGS. 4A, 4B, 4C, and 4D, shows the cross-sectional views for forming a filled isolation trench with nitrogen ions implanted into at least one side wall of the isolation trench for minimizing corner rounding and mechanical stress on the at least one side wall of the isolation trench, according to the present invention.

Referring to FIG. 4A, as in typical shallow trench isolation technology, an epitaxial silicon layer 402 is deposited on a semiconductor wafer 404. The present invention may be used when the epitaxial silicon layer 402 is a layer of any type of semiconductor material amenable for fabrication of integrated circuits therein. A pad oxide layer 406 comprised of silicon dioxide is deposited on the epitaxial silicon layer 402, and a nitride layer 408 comprised of silicon nitride is deposited on the pad oxide layer 406. A first isolation trench 410 and a second isolation trench 412 are patterned and etched using conventional photoresist patterning technology as known to one of ordinary skill in the art of integrated circuit fabrication. The first isolation trench 410 and the second isolation trench 412 isolate an active device region 411 in the epitaxial silicon layer 402.

The first isolation trench 410 and the second isolation trench 412 are etched in the epitaxial silicon layer 402 through the nitride layer 408 and the pad oxide layer 410. The first isolation trench 410 and the second isolation trench 412 each have at least one side wall and a bottom wall. In the example of FIG. 4A, the side walls and the bottom walls of the first and second isolation trenches 410 and 412 are formed by the semiconductor material (i.e. silicon in the example of FIG. 4A) of the epitaxial silicon layer 402.

In the present invention, once the first isolation trench 410 and the second isolation trench 412 are etched, nitrogen ions are implanted into the at least one side wall of the first isolation trench 410 and the second isolation trench 412 (as shown by the shading at the side walls of the first isolation trench 410 and the second isolation trench 412 in FIG. 4A). Typically, nitrogen ions are implanted also into the bottom wall of the first isolation trench 410 and the second isolation trench 412 (as shown by the shading at the bottom walls of the first isolation trench 410 and the second isolation trench 412 in FIG. 4A).

Such implantation of nitrogen ions into the side walls of the first isolation trench 410 and the second isolation trench 412 is achieved by an angled nitrogen ion implantation process. By angling the direction of travel of the nitrogen ions with respect to the surface of the semiconductor wafer 404, nitrogen ions are implanted into the side walls of the first isolation trench 410 and the second isolation trench 412. Such processes for implanting ions at an angle are known to one of ordinary skill the art of integrated circuit fabrication.

Figure 4B:
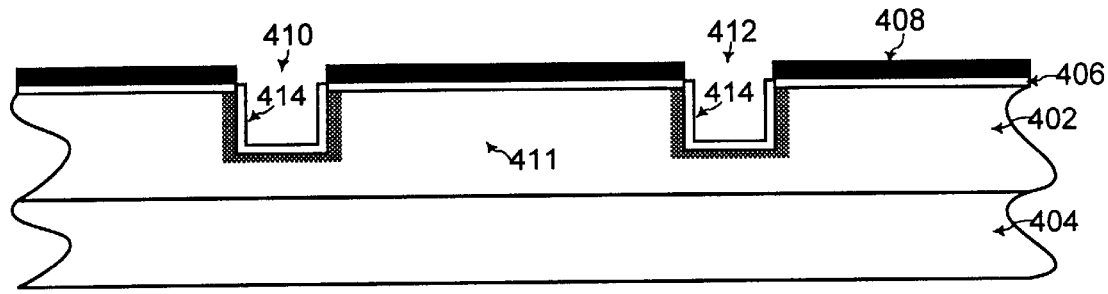

Referring to FIG. 4B, after the nitrogen ions are thus implanted into the at least one side wall of the first isolation trench 410 and the second isolation trench 412, a linear oxide layer 414 which is a layer of insulator material is thermally grown from the at least one side wall and the bottom wall of the first isolation trench 410 and the second isolation trench 412, as known to one of ordinary skill in the art of integrated circuit fabrication. Such thermal growth ensures a structurally smooth transition from the silicon at the at least one side wall and the bottom wall of an isolation trench to the silicon dioxide filling the isolation trench.

Figure 4C:
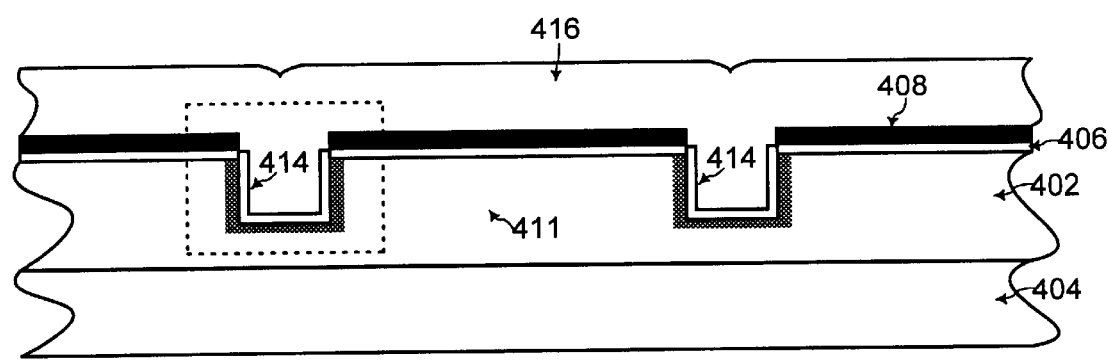

Referring to FIG. 4C, once the linear oxide layer 414 is thermally grown from the at least one side wall and the bottom wall of the isolation trenches 410 and 412, the isolation trenches 410 and 412 are filled with insulator material 416 such as silicon dioxide using a deposition process as known to one of ordinary skill in the art of integrated circuit fabrication. Typically, to enhance the insulating capability of the insulator material 416 such as the silicon dioxide filling the isolation trenches 410 and 412, the insulator material 416 thus deposited is densified using a thermal densification process as known to one of ordinary skill in the art of integrated circuit fabrication.

In this manner, because nitrogen ions are implanted into the at least one side wall of the isolation trenches 410 and 412 in the present invention, corner rounding and mechanical stress on the side wall of an isolation trench are reduced. Referring to FIG. 4D, a more realistic shape for the first isolation trench 410 within the box with the dashed lines in FIG. 4C is shown. A side wall 418 of the first isolation trench 410 is sloped and is rounded at the top and bottom of the side wall 418 to form a bird's beak, as known to one of ordinary skill in the art of integrated circuit fabrication. However, in contrast to the side wall 302 of the isolation trench of the prior art as shown in FIG. 3, the corner rounding of the isolation trench 410 of the present invention as shown in FIG. 4D is reduced.

The corner rounding at the top and bottom of a side wall of an isolation trench occurs during thermal growth of the layer of insulator material 414 from the side wall and the bottom wall of the isolation trench as the semiconductor material at the side wall and the bottom wall of the isolation trench is consumed during such a process. The amount of such corner rounding in the isolation trench 410 of the present invention may be measured by the radius of a circle 420 that fits to the rounded corner at the top of the isolation trench 410 of the present invention, as shown in FIG. 4D.

Figure 3:
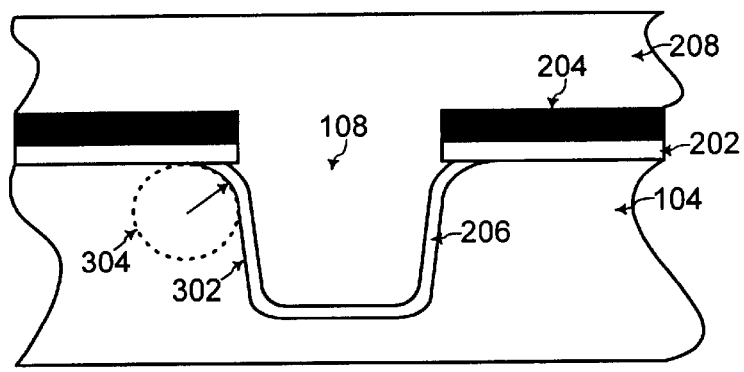
FIG. 3 shows an enlarged view of a filled isolation trench in FIGS. 1 and 2 having the realistic shape of the prior art.
Figure 4D:
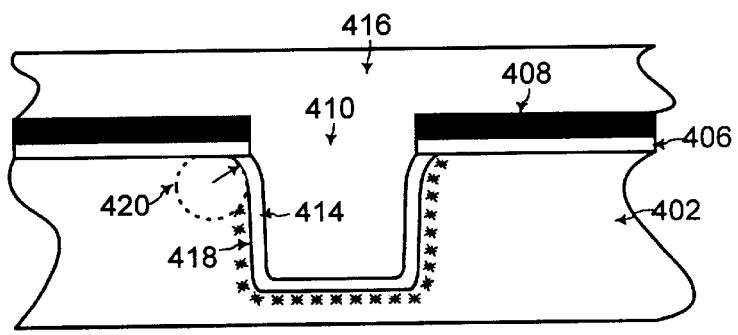

Referring to FIGS. 3 and 4D, the radius of the circle 420 that fits to the rounded corner of the isolation trench 410 of the present invention is smaller than the radius of the circle 304 that fits to the isolation trench 108 of the prior art. In the isolation trench 410 of the present invention, because nitrogen ions are implanted into the side wall 418 of the isolation trench 410, the semiconductor material at the side wall and the bottom wall of the isolation trench 410 is not consumed as readily during thermal growth of the layer of insulator material 414 from the side wall and the bottom wall of the isolation trench 410. Thus, the side wall of the isolation trench 410 of the present invention is not subject to as much corner rounding as in the isolation trench 108 of the prior art which does not have nitrogen ions implanted therein.

Referring to FIGS. 4A and 4D, with the present invention, with reduced corner rounding at the side wall of the isolation trench 410, the area of the active device region 411 is not as affected as for the isolating trench 108 of the prior art in FIG. 3. This aspect of the present invention is especially advantageous as device densities continuously increase and as device geometries continuously decrease with design of smaller geometry active device regions.

In addition, referring to FIG. 4D, with nitrogen ions implanted into the side wall 418 of the isolation trench 410 of the present invention, the side wall 418 of the isolation trench 410 is subject to less mechanical stress. Such mechanical stress may form especially from the thermal densification of the insulator material 416 filling the isolation trench 410 as the insulator material 416 expands or contracts within the isolation trench 410. As known to one of ordinary skill in the art of integrated circuit fabrication, nitrogen ions implanted into silicon render the silicon material, which may include silicon nitride as a result of the nitrogen ion implantation, more flexible and less prone to mechanical stress. With nitrogen ions implanted into the side wall 418 of the isolation trench 410, the side wall 418 of the isolation trench 410 is more flexible and less prone to mechanical stress from the insulator material 416 filling the isolation trench 410.

The mechanical stress on the side wall of an isolation trench has a detrimental effect on the devices within the active device region adjacent the isolation trench. As described in a technical journal article with title "Mechanical Stress Induced MOSFET Punch-Through and Process Optimization for Deep Submicron TEOS-$O_3$ filled STI Device," by K. Ishimaru et al. in the Symposium on VLSI Technology Digest of Technical Papers, 1997, pages 123–124, such mechanical stress results in failure of devices within the active device region. Thus, the reduced mechanical stress on the side wall 418 of the isolation trench 410 of the present invention is advantageous for ensuring operative devices within the active device region 411 adjacent the isolation trench 410.

Figure 2A:
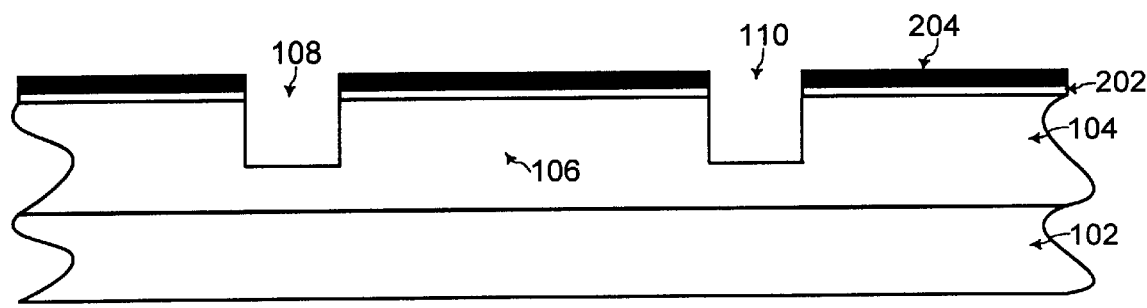
FIGS. 2A, 2B, 2C, 2D, 2E, and 2F, shows the cross-sectional views for forming the filled isolation trenches of FIG. 1 in conventional shallow trench isolation (STI) technology.
Figure 2B:
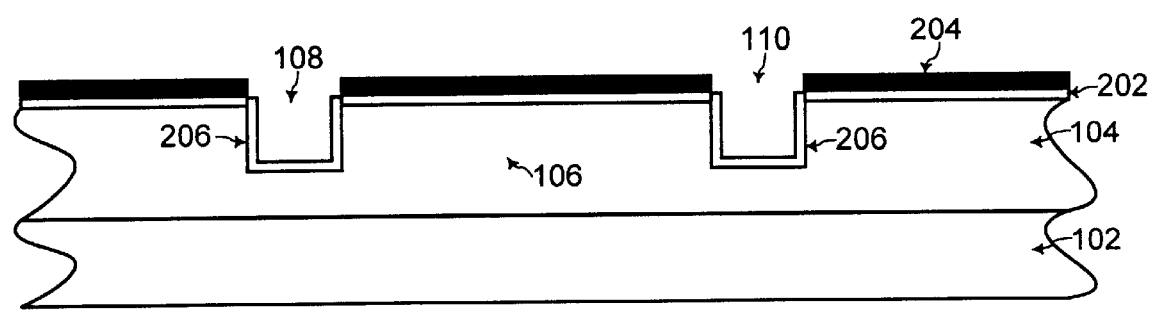
Figure 2C:
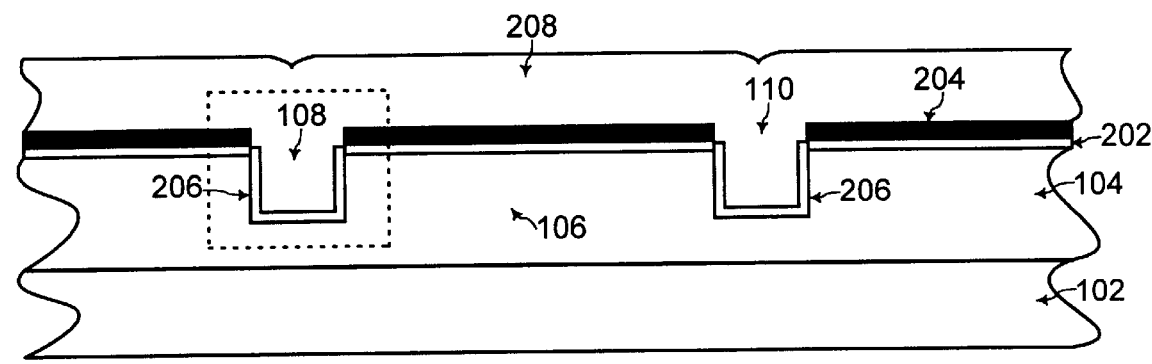
Figure 2D:
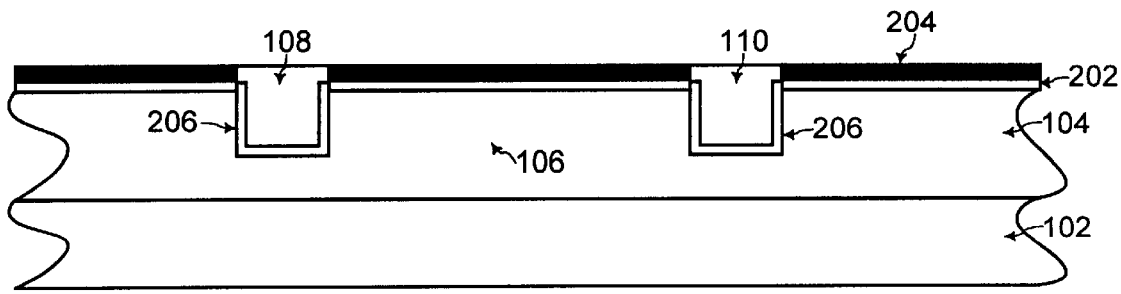
Figure 2E:
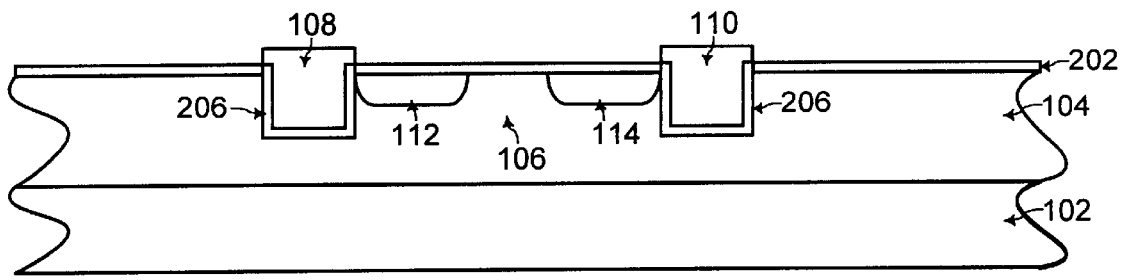
Figure 2F:
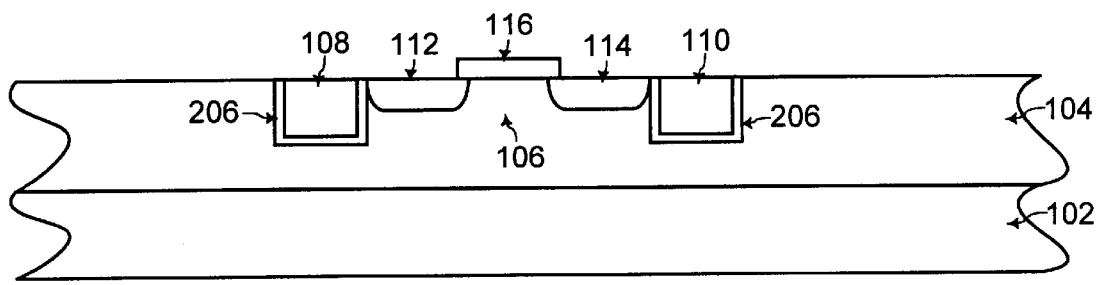

Referring to FIG. 4C, once the insulator material 416 fills the isolation trenches 410 and 412 of the present invention, the insulator material 416 may be polished down, and the integrated circuit may be fabricated within the active device region 411 in a manner similar to that described in reference to FIGS. 2D, 2E, and 2F.

Figure 5A:
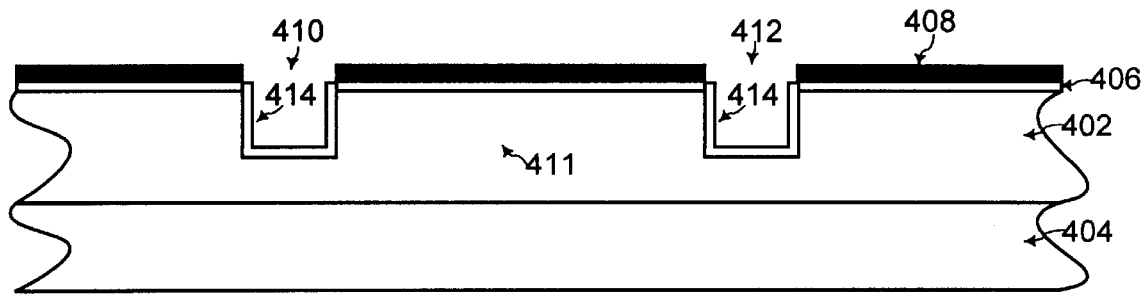
FIGS. 5A, 5B, and 5C, shows the cross-sectional views, of an alternative embodiment of the present invention from FIG. 4, for forming a filled isolation trench with nitrogen ions implanted into at least one side wall of the isolation trench after thermal growth of a layer of insulator material on the at least one side wall of the isolation trench.
Figure 5B:
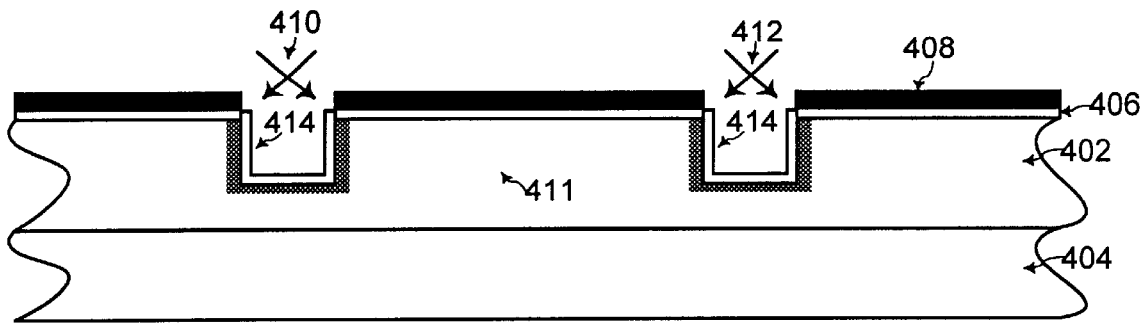
Figure 5C:
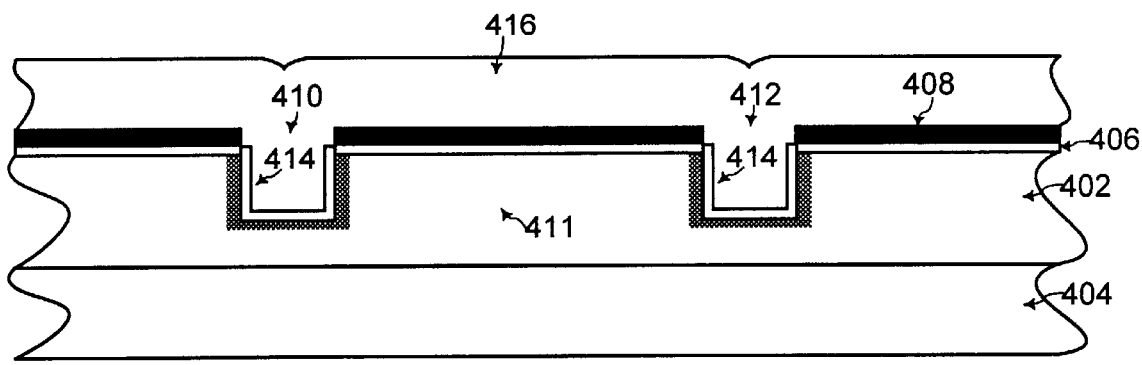

Referring to FIGS. 5A, 5B, and 5C, in an alternative embodiment of the present invention, the layer of insulator material 414 is thermally grown from the side walls and the bottom walls of the first isolation trench 410 and the second isolation trench 412 before the nitrogen ions are implanted into the side walls of the isolation trenches 410 and 412. Referring to FIG. 5A, the first isolation trench 410 and the second isolation trench 412 are etched in the epitaxial silicon layer 402 through the nitride layer 408 and the pad oxide layer 410. Once the first isolation trench 410 and the second isolation trench 412 are etched, the layer of insulator material 414 is thermally grown from the at least one side wall and the bottom wall of the first isolation trench 410 and the second isolation trench 412.

Referring to FIG. 5B, after the layer of insulator material 414 is thermally grown from the side walls and the bottom walls of the first isolation trench 410 and the second isolation trench 412, nitrogen ions are implanted into the at least one side wall of the first isolation trench 410 and the second isolation trench 412 (as shown by the shading at the side walls of the first isolation trench 410 and the second isolation trench 412 in FIG. 5B). Typically, nitrogen ions are implanted also into the bottom wall of the first isolation trench 410 and the second isolation trench 412 (as shown by the shading at the bottom walls of the first isolation trench 410 and the second isolation trench 412 in FIG. 5B).

The layer of insulator material 414 buffers the impact of the nitrogen ions bombarding into the side walls and the bottom walls of the first isolation trench 410 and the second isolation trench 412. Thus, structural damage to the side walls and the bottom walls of the first isolation trench 410 and the second isolation trench 412 during the nitrogen ion implantation is reduced. However, in the embodiment of the present invention shown in FIGS. 5A, 5B, and 5C, because the layer of insulator material 414 is grown from the side walls and the bottom walls of the first isolation trench 410 and the second isolation trench 412 before nitrogen ions are implanted into the side walls of the first isolation trench 410 and the second isolation trench 412, the corner rounding of the side wall of an isolation trench may not be reduced as much as in the embodiment of the present invention shown in FIGS. 4A, 4B, 4C, and 4D.

Referring to FIG. 5C, once nitrogen ions are implanted into the side walls of the first isolation trench 410 and the second isolation trench 412 as shown in FIG. 5B, the isolation trenches 410 and 412 are filled with insulator material 416 such as silicon dioxide using a deposition process as known to one of ordinary skill in the art of integrated circuit fabrication. Typically, to enhance the insulating capability of the insulator material 416 such as the silicon dioxide filling the isolation trenches 410 and 412, the insulator material 416 is densified using a thermal densification process as known to one of ordinary skill in the art of integrated circuit fabrication.

Referring to FIG. 5C, with nitrogen ions implanted into the side walls and bottom walls of the isolation trenches 410 and 412 of the present invention, the side walls of the isolation trenches 410 and 412 are subject to less mechanical stress. Referring to FIG. 5C, once the insulator material 416 fills the isolation trenches 410 and 412 of the present invention, the insulator material 416 may be polished down, and the integrated circuit may be fabricated within the active device region 411 in a manner similar to that described in reference to FIGS. 2D, 2E, and 2F.

Figure 6A:
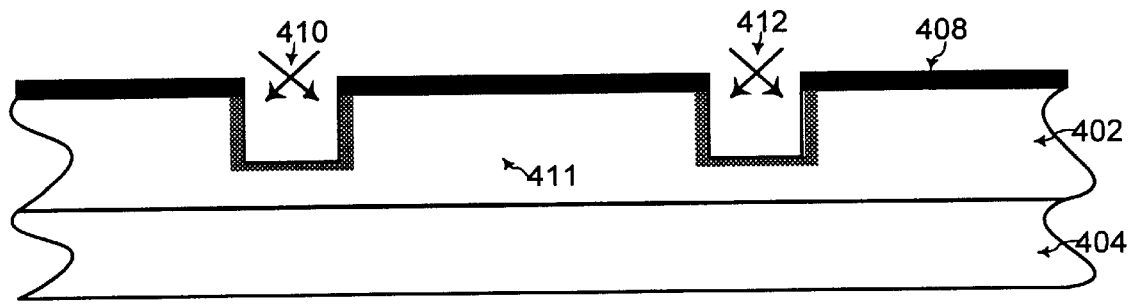
FIGS. 6A, 6B, 6C, and 6D, shows the cross-sectional views, of an alternative embodiment of the present invention from FIGS. 4 and 5, for forming a filled isolation trench with nitrogen ions implanted into at least one side wall of the isolation trench and with simultaneous growth of a layer of insulator material on the at least one side wall of the isolation trench and a pad oxide layer on the active device region.

Referring to FIGS. 6A, 6B, 6C, and 6D, in an alternative embodiment of the present invention, the pad oxide layer 406 is grown simultaneously with the layer of insulator material 414 thermally grown from the side walls and the bottom walls of the first isolation trench 410 and the second isolation trench 412. Referring to FIG. 6A, the first isolation trench 410 and the second isolation trench 412 are etched in the epitaxial silicon layer 402 through the nitride layer 408 deposited directly on the epitaxial silicon layer 402. In contrast to FIG. 4A, the pad oxide layer 406 is not yet grown on the epitaxial silicon layer 402.

Once the first isolation trench 410 and the second isolation trench 412 are thus etched, nitrogen ions are implanted into the at least one side wall of the first isolation trench 410 and the second isolation trench 412 (as shown by the shading at the side walls of the first isolation trench 410 and the second isolation trench 412 in FIG. 6A). Typically, nitrogen ions are implanted also into the bottom wall of the first isolation trench 410 and the second isolation trench 412 (as shown by the shading at the bottom walls of the first isolation trench 410 and the second isolation trench 412 in FIG. 6A).

Figure 6B:
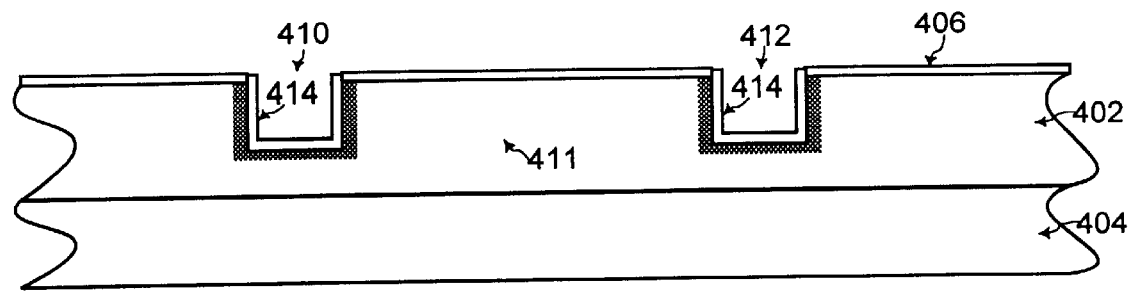

Referring to FIG. 6B, the nitride layer 408 is then removed from the epitaxial silicon layer 402. Then, the linear oxide layer 414 which is a layer of insulator material is thermally grown from the at least one side wall and the bottom wall of the first isolation trench 410 and the second isolation trench 412. In addition, during this thermal growth of the linear oxide layer 414, the pad oxide layer 406 is also thermally grown on the epitaxial silicon layer 402. With this embodiment of the present invention, the total number of integrated circuit fabrication processing steps are minimized since the pad oxide layer 406 and the linear oxide layer 414 are grown simultaneously.

Figure 6C:
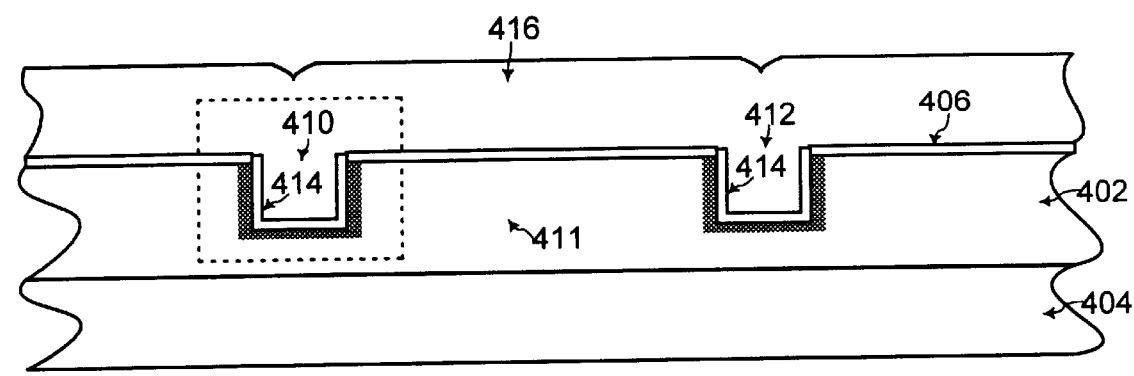

Referring to FIG. 6C, once the layer of insulator material 414 and the pad oxide layer 406 are grown, the isolation trenches 410 and 412 are filled with insulator material 416 such as silicon dioxide using a deposition process as known to one of ordinary skill in the art of integrated circuit fabrication. Typically, to enhance the insulating capability of the insulator material 416, such as the silicon dioxide filling the isolation trenches 410 and 412, the insulator material 416 is densified using a thermal densification process as known to one of ordinary skill in the art of integrated circuit fabrication.

Figure 6D:
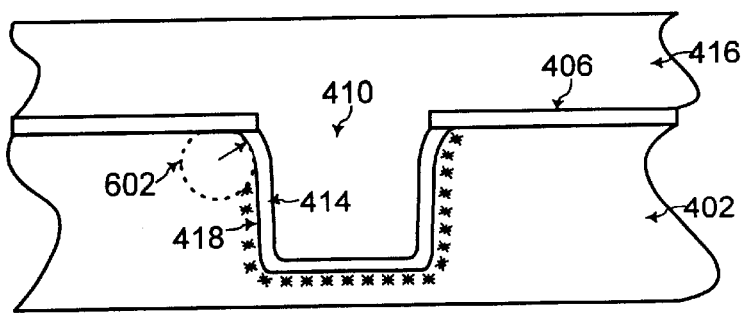

In this manner, with this embodiment of the present invention also, because nitrogen ions are implanted into the at least one side wall of the isolation trenches 410 and 412, corner rounding and mechanical stress on the at least one side wall of the isolation trench are reduced. Referring to FIG. 6D, a more realistic shape for the first isolation trench 410 within the box with the dashed lines in FIG. 6C is shown. In contrast to the side wall 302 of the isolation trench of the prior art as shown in FIG. 3, the corner rounding of the isolation trench 410 of the present invention as shown in FIG. 6D is reduced. Referring to FIGS. 3 and 6D, the radius of the circle 602 that fits to the rounded corner of the isolation trench 410 of the present invention in FIG. 6D is smaller than the radius of the circle 304 that fits to the isolation trench 108 of the prior art. In addition, referring to FIG. 6D, with nitrogen ions implanted into the side wall 418 of the isolation trench 410 of the present invention, the side wall 418 of the isolation trench 410 is subject to less mechanical stress.

Referring to FIG. 6C, once the insulator material 416 fills the isolation trenches 410 and 412 of the present invention, the insulator material 416 may be polished down to the pad oxide layer 406, and the integrated circuit may be fabricated within the active device region 411 in a manner similar to that described in reference to FIGS. 2E and 2F.

The foregoing is by way of example only and is not intended to be limiting. For example, the present invention may be practiced for any type of semiconductor material amenable for integrated circuit fabrication for the epitaxial silicon layer 104 and for any type of insulator material which may be grown from such semiconductor material, as would be apparent to one of ordinary skill in the art from the description herein. In addition, the present invention may be practiced for any type of active device region isolation technology having filled isolation trenches aside from the example shallow trench isolation (STI) technology described herein, as would be apparent to one of ordinary skill in the art from the description herein.

Furthermore, as will be understood by those skilled in the art, the integrated circuit structures described herein may be made or used in the same way regardless of their position and orientation. Accordingly, it is to be understood that terms and phrases such as "side wall," "bottom wall," "on top of," "top and bottom of," and "down to" as used herein refer to the relative location and orientation of various portions of the structures with respect to one another, and are not intended to suggest that any particular absolute orientation with respect to external objects is necessary or required.

The invention is limited only as defined in the following claims and equivalents thereof.

I claim:

1. A method for fabricating a filled isolation trench as part of an integrated circuit on a semiconductor wafer, the method including the steps of:

A. etching an isolation trench within a layer of semiconductor material, said isolation trench having at least one side wall comprised of said semiconductor material, and said isolation trench having a bottom wall, wherein said step A further includes the steps of:

depositing a nitride layer onto said layer of semiconductor material; and etching said isolation trench in said layer of semiconductor material through said nitride layer;

B. implanting nitrogen ions into said at least one side wall of said isolation trench and etching said nitride layer away from said layer of semiconductor material;

C. thermally growing simultaneously a layer of an insulator material from said at least one side wall and said bottom wall of said isolation trench and a pad oxide layer onto said layer of semiconductor material; and D. filling said isolation trench with said insulator material using a deposition process to form said filled isolation trench, wherein said nitrogen ions implanted into said at least one side wall of said isolation trench reduces a radius of a bird's beak formed on said at least one side wall of said isolation trench, and wherein said nitrogen ions implanted into said at least one side wall of said isolation trench reduces mechanical stress on said at least one side wall of said isolation trench from said insulator material filling said isolation trench.

2. The method of claim 1, further including the step of:

densifying said insulator material within said isolation trench with a thermal densification process.

3. The method of claim 1, wherein said step C of thermally growing said layer of insulator material from said at least one side wall and said bottom wall of said isolation trench is performed before said step B of implanting said nitrogen ions into said at least one side wall of said isolation trench such that said layer of insulator material on said at least one side wall of said isolation trench reduces structural damage to said at least one side wall of said isolation trench during implantation of nitrogen ions into said at least one side wall of said isolation trench.

4. The method of claim 1, wherein said step B of implanting said nitrogen ions into said at least one side wall of said isolation trench is performed before said step C of thermally growing said layer of insulator material from said at least one side wall and said bottom wall of said isolation trench such that said radius of said bird's beak formed on said at least one side wall of said isolation trench is minimized.

5. The method of claim 1, further including the steps of:

polishing down the insulator material, deposited on top of the semiconductor wafer during said step D, to said pad oxide layer using a chemical mechanical polishing (CMP) process;

implanting ions for forming active device regions in said layer of semiconductor material having exposed regions of said pad oxide layer; and etching off said pad oxide layer from said layer of semiconductor material.

6. The method of claim 5, further including the step of:

growing gate oxides on said layer of semiconductor material when said active device regions formed on said layer of semiconductor material is for MOSFETs (Metal Oxide Semiconductor Field Effect Transistors).

7. The method of claim 1, wherein said layer of semiconductor material is a layer of epitaxial silicon, and wherein said insulator material filling said isolation trench is silicon dioxide.

8. The method of claim 1, wherein said step B of implanting said nitrogen ions into said at least one side wall of said isolation trench includes using an angled nitrogen ion implantation process.

9. A method for fabricating a filled isolation trench as part of an integrated circuit on a semiconductor wafer, the method including the steps of:

A. etching an isolation trench within a layer of epitaxial silicon deposited on top of said semiconductor wafer, said isolation trench having at least one side wall comprised of said epitaxial silicon, and said isolation trench having a bottom wall, wherein said step A further includes the steps of:

depositing a nitride layer onto said layer of epitaxial silicon; and etching said isolation trench in said layer of epitaxial silicon through said nitride layer;

B. implanting nitrogen ions into said at least one side wall of said isolation trench using an angled nitrogen ion implantation process and etching said nitride layer away from said layer of semiconductor material;

C. thermally growing simultaneously a linear oxide layer of silicon dioxide from said at least one side wall and said bottom wall of said isolation trench and a pad oxide layer onto said layer of semiconductor material;

D. filling said isolation trench with silicon dioxide using a deposition process to form said filled isolation trench;

E. densifying said silicon dioxide within said isolation trench with a thermal densification process, wherein said step B of implanting said nitrogen ions into said at least one side wall of said isolation trench is performed before said step C of thermally growing said liner oxide layer from said at least one side wall and said bottom wall of said isolation trench such that a radius of a bird's beak formed on said at least one side wall of said isolation trench is minimized, wherein said nitrogen ions implanted into said at least one side wall of said isolation trench reduces said radius of said bird's beak formed on said at least one side wall of said isolation trench, and wherein said nitrogen ions implanted into said at least one side wall of said isolation trench reduces mechanical stress on said at least one side wall of said isolation trench from said silicon dioxide filling said isolation trench;

F. polishing down the silicon dioxide, deposited on top of the semiconductor wafer during said step D, to said pad oxide layer using a chemical mechanical polishing (CMP) process;

G. implanting ions for forming active device regions in said layer of epitaxial silicon having exposed regions of said pad oxide layer;

H. etching off said pad oxide layer from said layer of epitaxial silicon; and

I. growing gate oxides on said layer of epitaxial silicon when said active device regions formed on said layer of epitaxial silicon is for MOSFETs (Metal Oxide Semiconductor Field Effect Transistors).

* * * * *